(12) United States Patent
Anami

(10) Patent No.: US 9,723,736 B2
(45) Date of Patent: Aug. 1, 2017

(54) ELECTRICAL JUNCTION BOX

(71) Applicant: SUMITOMO WIRING SYSTEMS, LTD., Yokkaichi, Mie (JP)

(72) Inventor: Shuichi Anami, Yokkaichi (JP)

(73) Assignee: SUMITOMO WIRING SYSTEMS, LTD., Mie (JP)

( * ) Notice: Subject to any disclaimer, the term of this patent is extended or adjusted under 35 U.S.C. 154(b) by 300 days.

(21) Appl. No.: 14/431,582

(22) PCT Filed: Sep. 24, 2013

(86) PCT No.: PCT/JP2013/075745
§ 371 (c)(1),
(2) Date: Mar. 26, 2015

(87) PCT Pub. No.: WO2014/054465
PCT Pub. Date: Apr. 10, 2014

(65) Prior Publication Data
US 2015/0250070 A1    Sep. 3, 2015

(30) Foreign Application Priority Data
Oct. 4, 2012    (JP) ................................ 2012-222262

(51) Int. Cl.
| | |
|---|---|
| H05K 5/02 | (2006.01) |
| H05K 7/14 | (2006.01) |
| H05K 7/02 | (2006.01) |
| B60R 16/023 | (2006.01) |

(52) U.S. Cl.
CPC ......... *H05K 5/0239* (2013.01); *H05K 5/0247* (2013.01); *H05K 7/026* (2013.01); *H05K 7/14* (2013.01); *B60R 16/0238* (2013.01)

(58) Field of Classification Search
CPC combination set(s) only.
See application file for complete search history.

(56) References Cited

U.S. PATENT DOCUMENTS

| | | | |
|---|---|---|---|
| 7,671,275 B2* | 3/2010 | Kubota | H01R 13/5227 174/17 R |
| 9,142,944 B2* | 9/2015 | Makino | H02G 3/088 |
| 2008/0299799 A1 | 12/2008 | Yoshida et al. | |

FOREIGN PATENT DOCUMENTS

| | | |
|---|---|---|
| JP | 2003-137031 A | 5/2003 |
| JP | 2008-295263 A | 12/2008 |
| JP | 2011-193594 A | 9/2011 |

OTHER PUBLICATIONS

Nov. 26, 2013 International Search Report issued in International Application No. PCT/JP2013/075745.

* cited by examiner

*Primary Examiner* — Dhirubhai R Patel
(74) *Attorney, Agent, or Firm* — Oliff PLC

(57) ABSTRACT

An electrical junction box has a main body provided with a circuit board, and a cover externally fitted to the main body. The electrical junction box is assembled in a state in which the main body is accommodated in the cover. The main body includes an opposing surface that opposes an inner surface of the cover. The opposing surface has a water capturing hole that is a recess that opens toward the inner surface of the cover. A first opposing distance between the inner surface of the cover and an upper opening edge of the water capturing hole is larger than a second opposing distance between the inner surface of the cover and a lower opening edge of the water capturing hole.

12 Claims, 10 Drawing Sheets

ELECTRICAL JUNCTION BOX

BACKGROUND

This application is a national stage application of PCT/JP2013/075745, international filing date Sep. 24, 2013, and claims priority to JP 2012-222262, filed in Japan on Oct. 4, 2012, the entire disclosures of which are hereby incorporated by reference in their entirety.

The present invention relates to an electrical junction box in which a cover is assembled to a main body provided with a circuit board, and in particular to an electrical junction box in which a cover is externally fitted to a main body and is assembled in a state in which the main body is accommodated in the cover.

Conventionally, electrical junction boxes are used in automobiles and the like in order for electrical components such as fuses, relays, and the like to be arranged space-efficiently, for example. As such an electrical junction box, an electrical junction box as disclosed in, for example, JP 2008-295263A is known that has a structure in which a cover is externally fitted to a main body provided with a circuit board such as a printed-circuit board, and the main body is accommodated in the cover.

Meanwhile, in view of the demand for downsizing in recent years, an electrical junction box as disclosed in JP 2008-295263A is configured such that a cover is externally fitted to a main body with almost no gap, and the outer surface of the main body and the inner surface of the cover face each other with a very small micro-gap.

Therefore, if water enters the cover through, for example, a gap between the open end of the cover and the main body, capillary action may occur in the micro-gap between the outer surface of the main body and the inner surface of the cover, and water may deeply enter the cover. Furthermore, there is the risk that the water that has entered the cover reaches the circuit board of the main body, resulting in a short circuit or corrosion of the circuit board.

SUMMARY

Preferred embodiments were made in view of the above-described circumstances, and it is an object thereof to provide an electrical junction box having a novel structure that is capable of preventing water that has entered a cover from reaching a circuit board.

A first aspect of a preferred embodiment includes an electrical junction box having a main body provided with a circuit board, and a cover externally fitted to the main body. The electrical junction box is assembled in a state in which the main body is accommodated in the cover. The main body includes an opposing surface that opposes an inner surface of the cover. The opposing surface has a water capturing hole that is a recess that opens toward the inner surface of the cover. A first opposing distance between the inner surface of the cover and an upper opening edge of the water capturing hole is larger than a second opposing distance between the inner surface of the cover and a lower opening edge of the water capturing hole.

In the electrical junction box having the disclosed structure, water that moves in a micro-gap between the main body and the cover can be captured in the water capturing hole. Accordingly, it is possible to prevent water that has entered the cover from reaching the circuit board. Particularly, since the opposing distance between the upper opening edge of the water capturing hole and the inner surface of the cover is larger than the opposing distance between the lower opening edge of the water capturing hole and the inner surface of the cover, it is possible to prevent capillary action from occurring between the upper opening edge and the inner surface of the cover. Accordingly, by preventing water captured in the water capturing hole from moving upward relative to the water capturing hole due to capillary action, it is possible to reliably capture the water in the water capturing hole. As a result, it is possible to prevent the circuit board from getting wet, and to prevent a short circuit or corrosion of the circuit board that may be caused by the circuit board getting wet.

A second aspect of the preferred embodiment has the electrical junction box according to the first aspect, wherein an opening of the water capturing hole has, for example, an elongated rectangular shape extending in a horizontal direction, and a depth dimension of the water capturing hole is set to a dimension greater than or equal to a longitudinal dimension of the opening. In this aspect, a depth dimension of the water capturing hole is ensured to be large, and thus the water capturing hole is shaped with a deep bottom. Accordingly, even when a vehicle is inclined for example, it is possible to reduce the risk that water captured in the water capturing hole runs over.

A third aspect of the preferred embodiment has the electrical junction box according to the first or second aspect, wherein the opposing surface of the main body that opposes the inner surface of the cover is provided with a water capturing groove for guiding water in the horizontal direction using capillary action, the water capturing groove being provided vertically below the water capturing hole.

According to this aspect, water that climbs between the main body and the cover due to capillary action can be captured in the water capturing groove before reaching the water capturing hole. Particularly, since the water capturing groove guides the water in the horizontal direction actively using capillary action, it is possible to reduce the risk that the water runs over from the water capturing groove and to capture the water more reliably. Furthermore, the two types of capturing means, namely, the water capturing groove and the water capturing hole can prevent the water from reaching the circuit board more reliably.

A fourth aspect of the preferred embodiment has the electrical junction box according to any one of the first to third aspects, wherein a water receiving section that is a recess that opens vertically upward is formed vertically above the water capturing hole of the main body.

According to this aspect, even when, due to large inclination, shake, or the like of a vehicle, water has run over from the water capturing hole and come around above the upper opening edge, it is possible to retain the water in the water receiving section, preventing the water from being further spread. Accordingly, it is possible to more reliably prevent the circuit board from getting wet.

A fifth aspect of the preferred embodiment has the electrical junction box according to any one of the first to fourth aspects, wherein the main body includes a connector accommodating section that opens vertically downward, and the water capturing hole is formed vertically above and adjacent to the connector accommodating section, a lower wall section of the water capturing hole being common with an upper wall section of the connector accommodating section.

According to this aspect, it is possible to advantageously use a space vertically above the connector accommodating section to form the water capturing hole space-efficiently. Furthermore, it is possible to advantageously ensure the depth dimension of the water capturing hole using the size of the connector accommodating section.

In the preferred embodiments, the opposing surface of the main body that opposes the cover is provided with a water capturing hole, and thereby it is possible for water that has moved between the main body and the cover to be captured in the water capturing hole. Furthermore, an opposing distance between the cover and the upper opening edge positioned vertically above the water capturing hole is larger than an opposing distance between the cover and the lower opening edge positioned vertically below the water capturing hole. Therefore, it is possible to prevent capillary action from occurring between the upper opening edge of the water capturing hole and the cover, to prevent water from moving upward relative to the water capturing hole due to capillary action, and to reliably capture the water in the water capturing hole. As a result, it is possible to prevent the water that has entered the cover from reaching the circuit board, preventing a short circuit or corrosion of the circuit board that may be caused by the circuit board getting wet.

DETAILED DESCRIPTION OF EMBODIMENTS

Hereinafter, preferred embodiments will be described with reference to the drawings.

Figure 1:
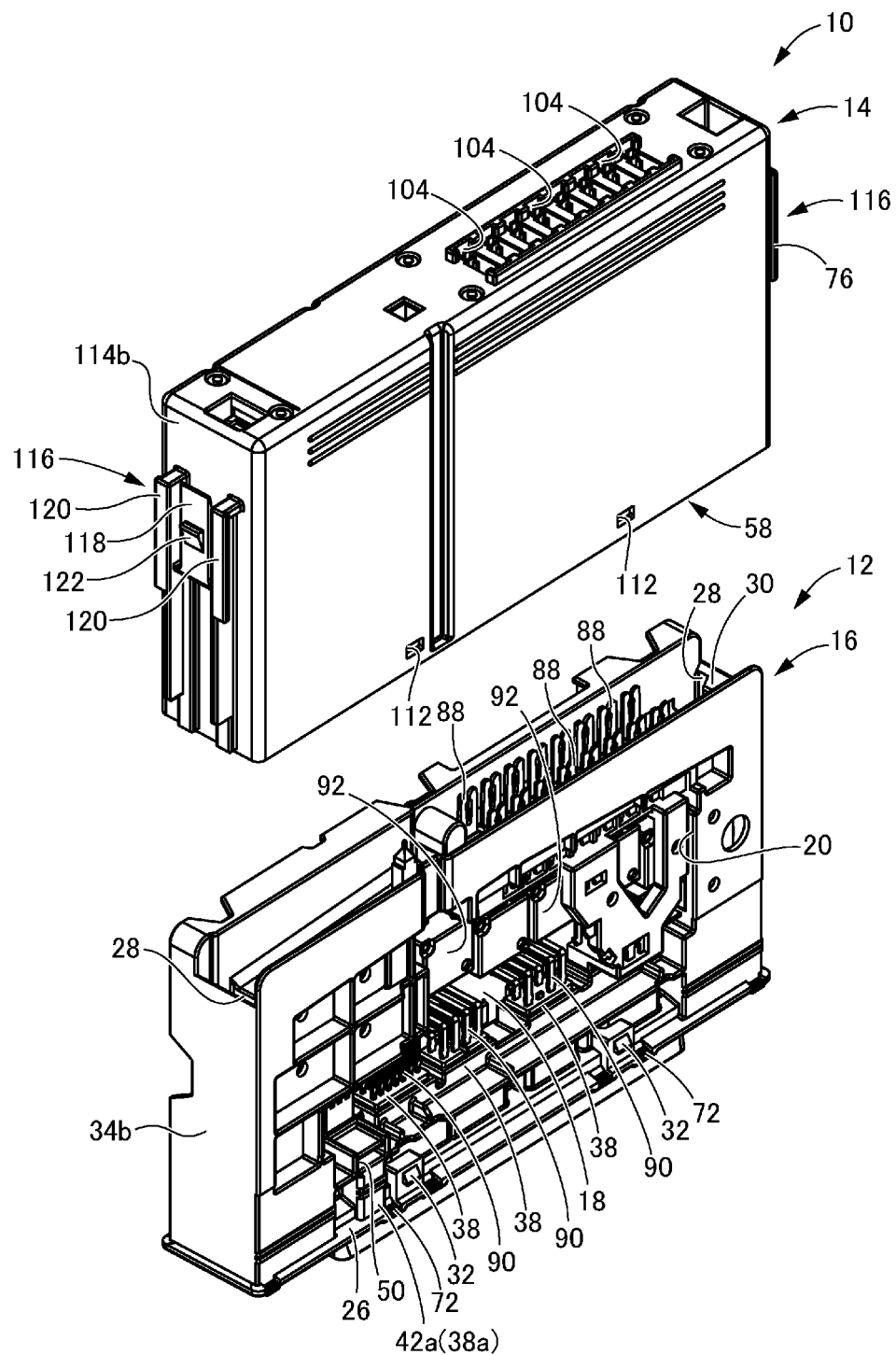
FIG. 1 is an exploded perspective view showing an electrical junction box serving as a preferred embodiment.

First, FIG. 1 shows an electrical junction box 10 serving as a preferred embodiment. The electrical junction box 10 includes a main body 12 and a cover 14, and by being externally fitted to the main body 12, the cover 14 may be assembled such that the main body 12 is accommodated in the cover 14. The electrical junction box 10 may be accommodated in, for example, another electrical junction box such as a relay box, and may be mounted in a vehicle such as an automobile.

Figure 2:
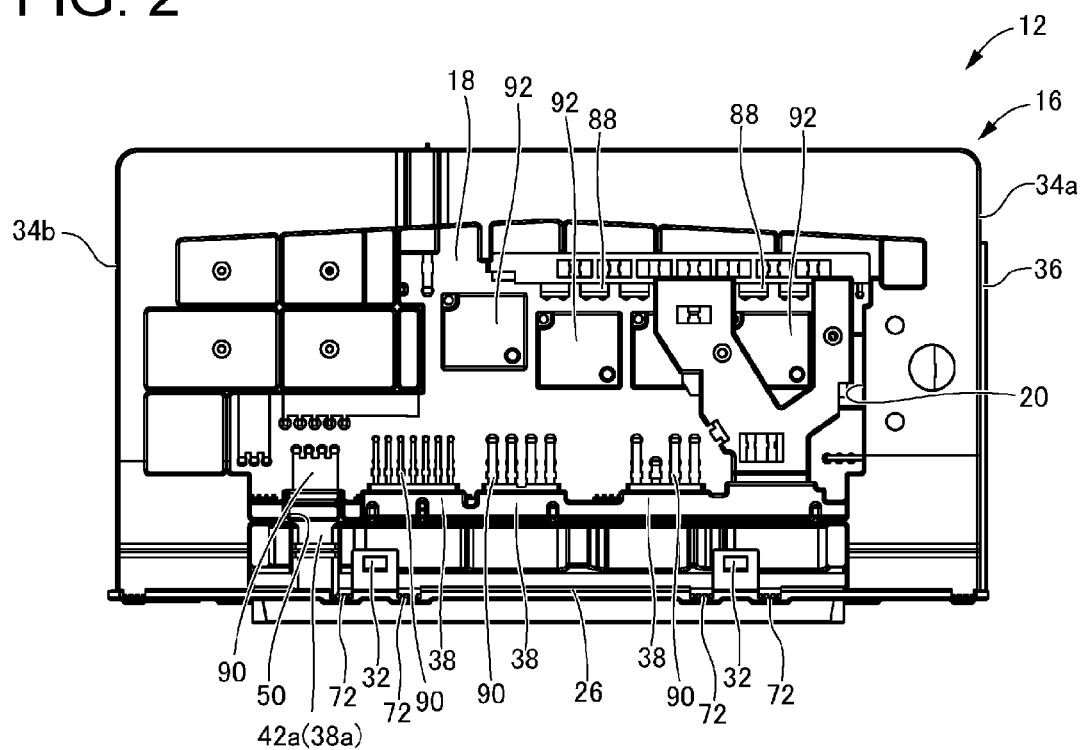
FIG. 2 is a front view showing a main body.
Figure 3:
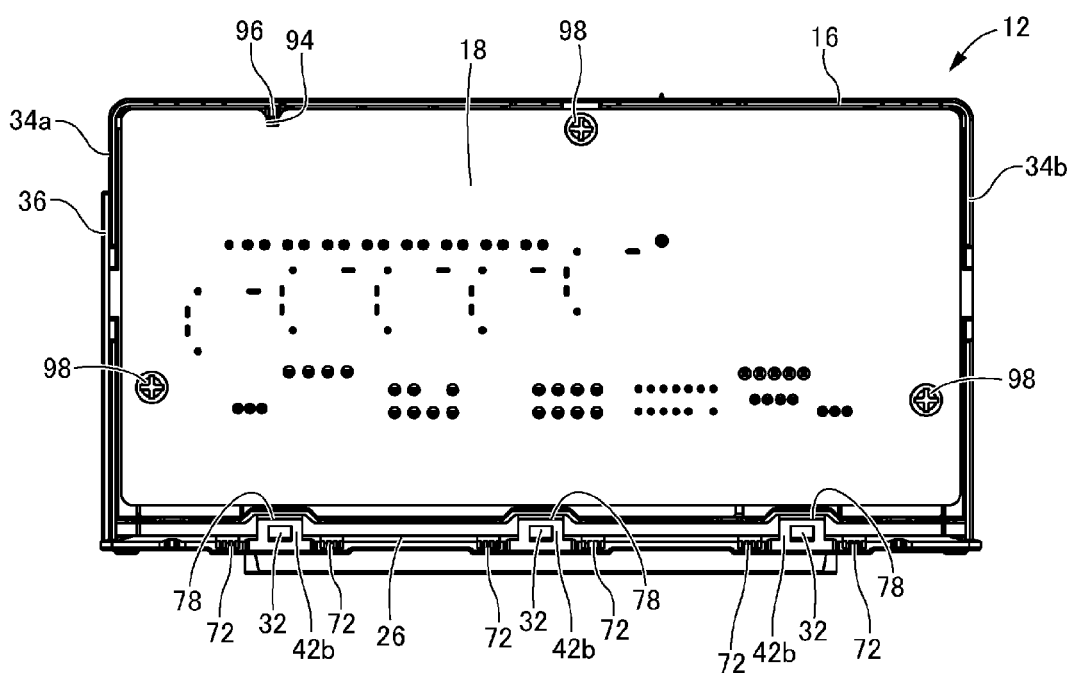
FIG. 3 is a rear view showing the main body.
Figure 4:
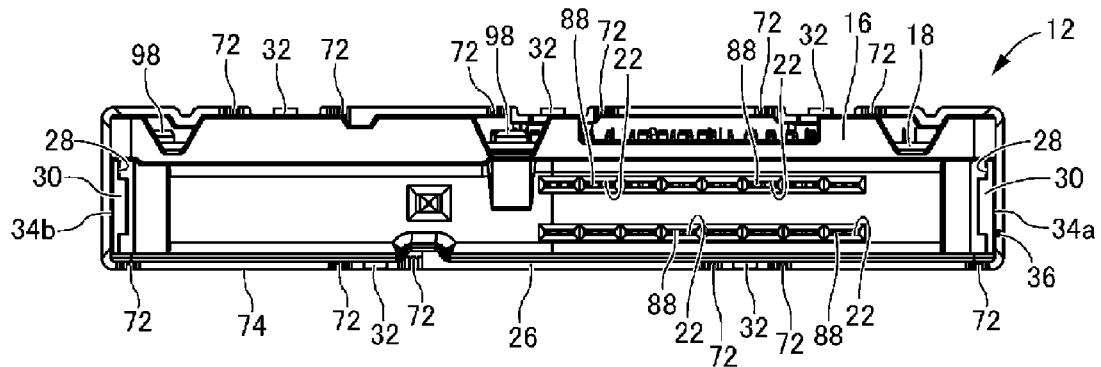
FIG. 4 is a top view showing the main body.

FIGS. 2 to 4 show the main body 12. The main body 12 may have, for example, an elongated rectangular block shape as a whole. The main body 12 may have a structure in which a printed-circuit board 18 serving as a circuit board is assembled in a frame 16 made of a synthetic resin. Note that the circuit board is not limited to a printed-circuit board, and may also be a circuit board formed with busbars and the like. The main body 12 may be configured to be mounted in a vehicle such that the up-down direction in FIG. 2 is the vertical up-down direction. In the following description, the vertical direction refers to the vertical direction in FIG. 2.

The frame 16 may have a shape of, for example, a substantially elongated rectangular frame that has, in the center thereof, a center hole 20. As shown in FIG. 4, a plurality of fuse terminal insertion holes 22 into which fuse terminals 88, which will be described later, may be inserted are formed, for example, in parallel to each other in two lines on substantially half of the upper surface of the frame 16 with respect to the longitudinal direction, and the fuse terminal insertion holes 22 in the respective lines face each other.

Furthermore, an abutment restricting surface 26 may be formed on the lower end of the frame 16. As is clear from FIG. 4, the abutment restricting surface 26 may be formed protruding outward from the frame 16 and extending continuously over substantially the entire periphery of the frame 16. Furthermore, as is clear from, for example, FIG. 6, which will be described later, the abutment restricting surface 26 may be an inclined surface that is inclined downward as it extends outward from the frame 16.

Furthermore, drain holes 28 that are formed penetrating through the frame 16 in the vertical direction may be respectively formed on two ends in the longitudinal direction (the horizontal direction in FIG. 4) of the frame 16. The inner surface of each of the drain holes 28 that is located outward in the longitudinal direction of the frame 16 has a main locking claw 30 protruding inward in the drain hole 28.

Furthermore, a plurality of sub locking claws 32 may be formed slightly above the abutment restricting surface 26 on the front surface (see FIG. 2) and the rear surface (see FIG. 3) of the frame 16. Each sub locking claw 32 is formed protruding outward from the frame 16. The sub locking claws 32 may be formed with appropriate intervals in the direction of the perimeter of the frame 16, two sub locking claws being formed on the front surface of the frame 16 and three sub locking claws being formed on the rear surface of the frame 16.

Furthermore, a side wall 34a located at one end in the longitudinal direction of the frame 16 may have a guide rib 36. The guide rib 36 may protrude outward from the side wall 34a in the longitudinal direction of the frame 16, and extend in a straight line over substantially the entire length in the vertical direction of the side wall 34a. On the other hand, a side wall 34b that is opposite to the side wall 34a may be a flat surface. Accordingly, the guide rib 36 may be formed at only one location on the periphery of the main body 12.

Figure 5:
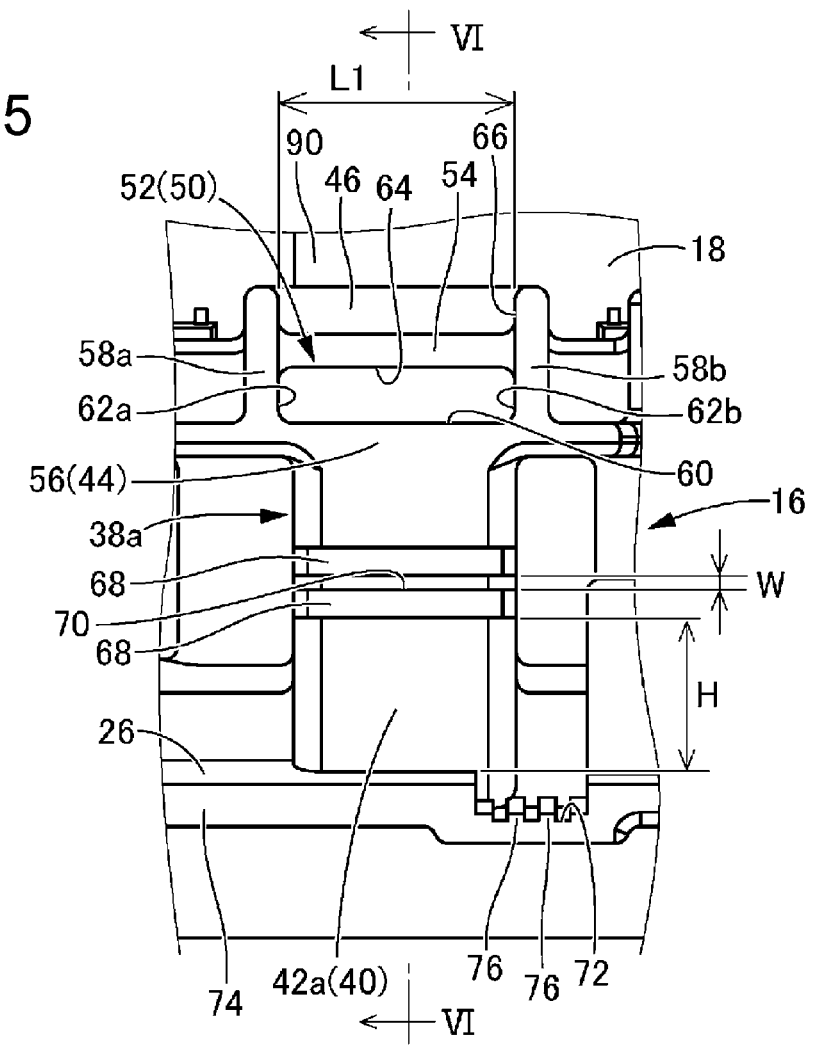
FIG. 5 is an enlarged view of a relevant part of the front surface of the main body.
Figure 6:
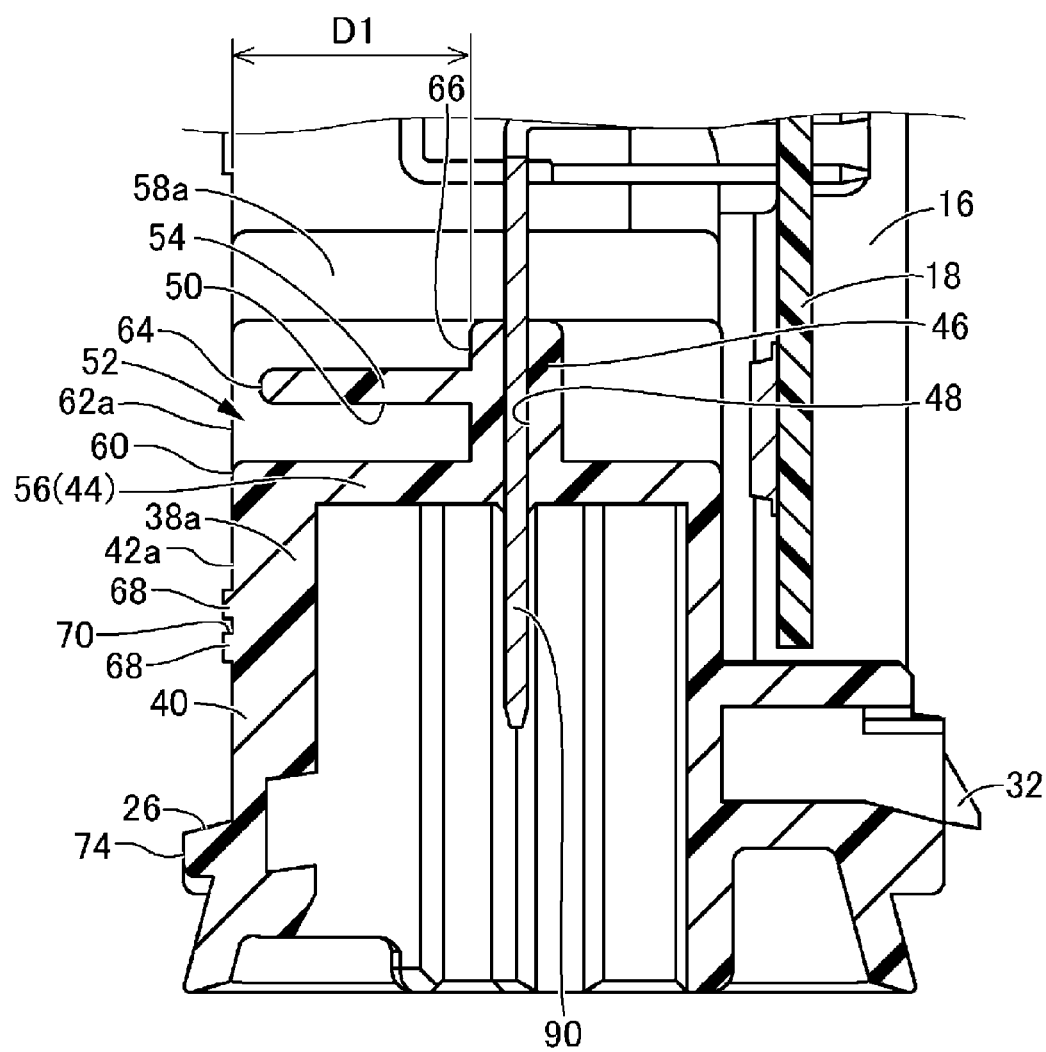
FIG. 6 is a cross-sectional view taken along the line VI-VI of FIG. 5.

Furthermore, on the lower part of the frame 16, a plurality of connector accommodating sections 38 into which connector terminals 90, which will be described later, may be inserted are formed in a line in the longitudinal direction of the frame 16. As shown in FIGS. 5 and 6 in which a connector accommodating section 38a is taken as an example, each connector accommodating section 38 has a shape of a recess that opens vertically downward.

The connector accommodating section 38a shown in FIGS. 5 and 6 has a periphery wall 40 that partially protrudes outward (leftward in FIG. 6) from the frame 16, and an opposing surface 42a of the main body 12 that opposes the cover 14 is formed by the protruding surface of the periphery wall 40. The opposing surface 42a may be a flat surface extending in the vertical up-down direction, with the exception of water stopping protrusions 68, which will be described later. In the central part of an upper wall section 44 that constitutes a bottom surface of the recess-shape of the connector accommodating section 38a, a terminal supporting wall 46 that protrudes upward and extends in the horizontal direction (the horizontal direction in FIG. 5) is formed. Furthermore, a connector terminal insertion hole 48 may be formed penetrating through the terminal supporting wall 46 and upper wall section 44 in the vertical direction.

A water capturing hole 50 may be formed above the connector accommodating section 38a. The water capturing hole 50 has the shape of a recess that opens at the opposing surface 42a. An opening 52 of the water capturing hole 50 may have, for example, an elongated rectangular shape that extends in the horizontal direction, and is formed with upper and lower wall sections 54 and 56 that face each other in the vertical up-down direction, and a pair of side wall sections 58a and 58b that face each other in the horizontal direction. The lower wall section 56 of the water capturing hole 50 is formed by the upper wall section 44 of the connector accommodating section 38a. Accordingly, the water capturing hole 50 is formed vertically above and adjacent to the connector accommodating section 38a. Furthermore, the terminal supporting wall 46 forms the bottom surface of the recess-shaped water capturing hole 50.

Note that it is preferable that the water capturing hole 50 is shaped with a deep bottom, and as large a depth dimension as possible is ensured. In the case where the opening 52 is formed with an elongated shape as in the present embodiment, it is preferable that a depth dimension D1 of the water capturing hole 50 is set to a longitudinal size L1 of the opening 52 or more. In the present embodiment, the depth dimension D1 of the water capturing hole 50 is set to be equal to the longitudinal size L1 of the opening 52.

Furthermore, as is clear from FIG. 6, a lower opening edge 60 of the water capturing hole 50 that is located vertically below, and lateral opening edges 62a and 62b that are located on two sides in the horizontal direction thereof may be coplanar with the opposing surface 42a. On the other hand, an upper opening edge 64 of the water capturing hole 50 that is located vertically above is located further inside (rightward in FIG. 6) the main body 12 than the lower opening edge 60 and the lateral opening edges 62a and 62b.

Furthermore, the side wall sections 58a and 58b and the terminal supporting wall 46 protrude upward from the upper wall section 54. Accordingly, vertically above the water capturing hole 50, with the upper wall section 54 therebetween, a recess-shaped water receiving section 66 is formed that opens upward, and is formed by the upper wall section 54, serving as the bottom, the side wall sections 58a and 58b, and the terminal supporting wall 46.

Furthermore, vertically below the water capturing hole 50, the pair of water stopping protrusions 68 is formed on the opposing surface 42a. The water stopping protrusions 68 are protrusions that protrude from the opposing surface 42a and extend in, for example, a straight line in the horizontal direction (the horizontal direction in FIG. 5), and the water stopping protrusions 68 may be formed over the entire horizontal length of the opposing surface 42a. The water stopping protrusions 68 may be formed, for example, in parallel to each other with a small gap in the vertical direction, and a water capturing groove 70 is formed by the gap between the water stopping protrusions 68. Accordingly, the water capturing groove 70 may have a groove shape that is located vertically below the water capturing hole 50 and extends in the horizontal direction. A groove width (size in the vertical up-down direction) W of the water capturing groove 70 is set to a very small width to the extent that capillary action can occur, and may be set to, for example, about 0.2 mm. Furthermore, a separation distance H between the lower water stopping protrusion 68 and the abutment restricting surface 26 is ensured to be a size that prevents water from climbing due to capillary action, and may be set to about 10 mm, for example, in the present embodiment.

Furthermore, the abutment restricting surface 26 has a plurality of drain recesses 72 that may be formed with an appropriate distance from one another in the direction of the perimeter thereof. These drain recesses 72 have substantially the same shape and have, as shown in FIG. 5 as well, the shape of a recessed groove that opens on the abutment restricting surface 26 and protrudes outward from the frame 16. Each drain recess 72 opens at an outer periphery edge 74 of the abutment restricting surface 26. Note that the bottom surface of each drain recess 72 has a plurality of ribs 76 that extend, for example, parallel to the drain recesses 72 with a predetermined distance from each other, and protrude therefrom, thus preventing water being drained through the drain recess 72 from staying in the drain recess 72 due to surface tension or the like. One of such drain recesses 72 may be formed adjacent to one end edge of the opposing surface 42a (the right edge of FIG. 5).

Figure 7:
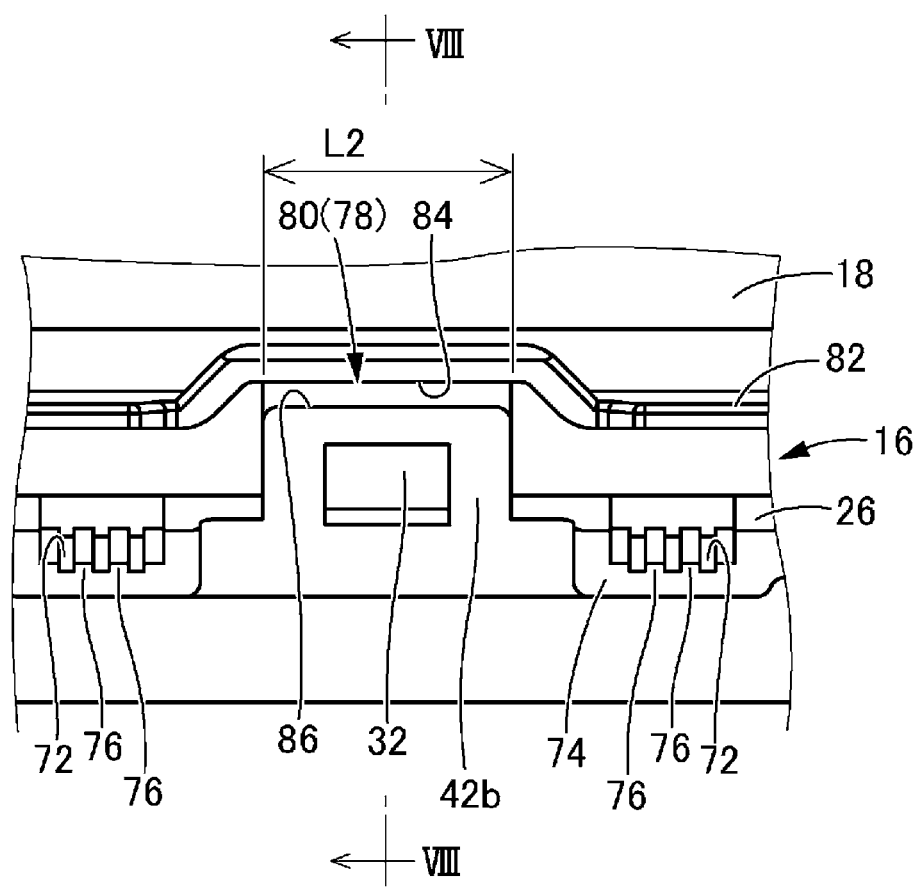
FIG. 7 is an enlarged view of a relevant part of the rear surface of the main body.
Figure 8:
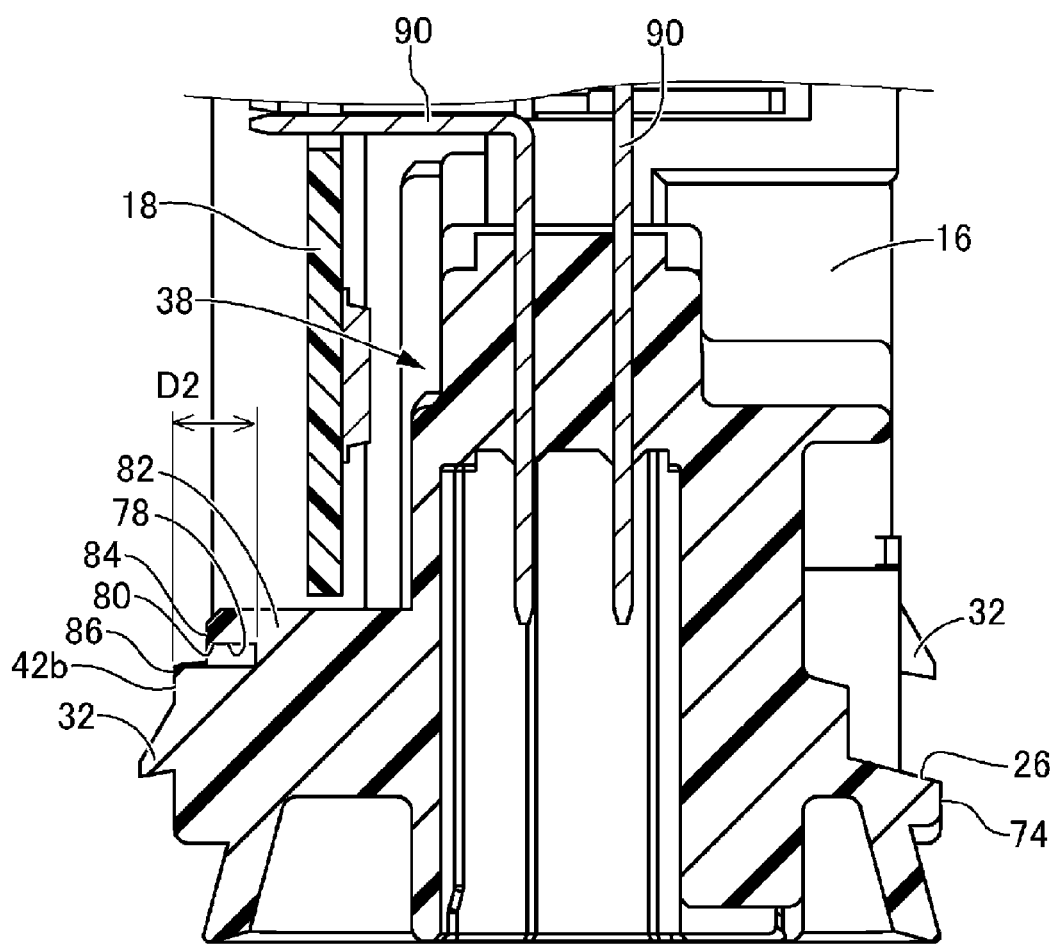
FIG. 8 is a cross-sectional view taken along the line VIII-VIII of FIG. 7.

Furthermore, water capturing holes 78 may be also formed above the sub locking claws 32 that are provided on the rear surface of the frame 16 (see FIG. 3). These water capturing holes 78 have substantially the same structure, and thus description will be given with reference to FIGS. 7 and 8, taking the water capturing hole 78 of the centrally located sub locking claw 32 as an example.

Outer surfaces of the rear surface of the frame 16 from which the sub locking claws 32 protrude serve as the opposing surfaces 42b that oppose the cover 14. Each water capturing hole 78 has the shape of a recess that opens on an opposing surface 42b above the corresponding sub locking claw 32. The water capturing hole 78 has an elongated rectangular opening 80. Note that a depth dimension D2 of the water capturing hole 78 is smaller than a longitudinal size L2 of the opening 80.

The upper wall section of the water capturing hole 78 may be formed by a lower periphery wall 82 that extends in the horizontal direction at the lower end of the rear surface of the frame 16, and constitutes the lower end of a region for accommodating the printed-circuit board 18. As is clear from FIG. 8, the lower periphery wall 82 is located further inside (rightward in FIG. 8) the main body 12 than the opposing surface 42b, and an upper opening edge 84 of the water capturing hole 78 that is formed by the lower periphery wall 82 is located further inside (rightward in FIG. 8) the main body 12 than the lower opening edge 86 located on the opposing surface 42b.

Furthermore, the drain recesses 72 may be formed on the two sides of the water capturing hole 78 on the abutment restricting surface 26.

The printed-circuit board 18 may be assembled to that rear surface (see FIG. 3) of the frame 16. The printed-circuit board 18 has, for example, an elongated rectangular plate shape extending over substantially the entire rear surface of the frame 16. The printed-circuit board 18 may be provided with a plurality of fuse terminals 88, which may be connected to fuses (not shown), and a plurality of connector terminals 90, which may be connected to connectors (not shown). These fuse terminals 88 and connector terminals 90 may be bent in, for example, an L-shape. Furthermore, a plurality of relays 92 may be provided in the central portion of the printed-circuit board 18.

The printed-circuit board 18 may be assembled to the frame 16 such that, for example, the fuse terminals 88 and the connector terminals 90 are inserted in advance into the fuse terminal insertion holes 22 and the connector terminal insertion holes 48 of the frame 16, and, in this state, the printed-circuit board 18 on which the relays 92 are provided is overlaid on the rear surface of the frame 16. Note that, as shown in FIG. 3, a notch 94 may be formed on the periphery of the printed-circuit board 18, and the printed-circuit board 18 may be positioned with respect to the frame 16 by a positioning protrusion 96 of the frame 16 being inserted into the notch 94. Accordingly, the fuse terminals 88 and the connector terminals 90 are inserted through the corresponding through holes of the printed-circuit board 18. Furthermore, after the printed-circuit board 18 is fixed to the frame 16 with a plurality (three in the present embodiment) of bolts 98, the fuse terminals 88 and the connector terminals 90 are fixed to the printed-circuit board 18 by, for example, soldering. Accordingly, ends of the connector terminals 90 are arranged inside the connector accommodating sections 38 through the connector terminal insertion holes 48. The main body 12 is configured in this manner.

Figure 9:
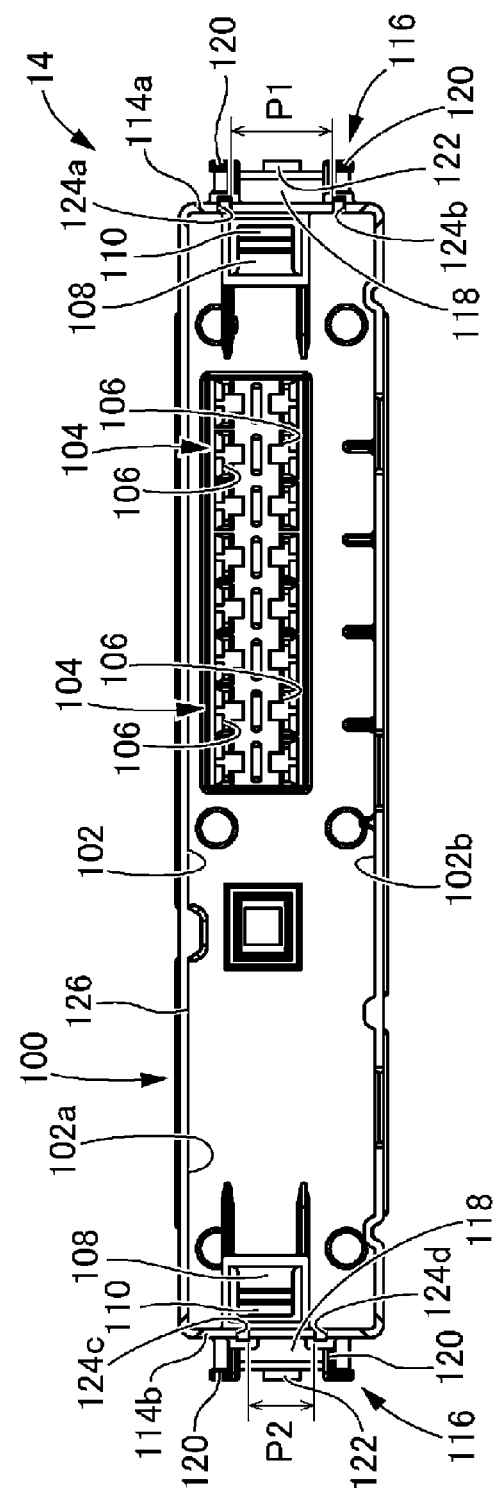
FIG. 9 is a diagram showing a lower surface of a cover.

On the other hand, the cover 14 may be, for example, a synthetic resin molded article that may be formed into one piece. FIG. 9 shows the lower surface of the cover 14. The cover 14 has, for example, an elongated rectangular box shape, and has an opening 100 on one side thereof. Among inner surfaces 102 of the cover 14, inner surfaces 102a and 102b that oppose the opposing surfaces 42a and 42b of the main body 12 may be flat. The upper surface of the cover 14 has a plurality of fuse mounted sections 104 that are formed in one line over substantially half of the upper surface of the cover 14 with respect to the longitudinal direction. Each fuse mounted section 104 has a pair of terminal insertion holes 106 that penetrate through the upper surface of the cover 14 and oppose each other.

Furthermore, a pair of main locks 108 may be formed on the two longitudinal ends of the cover 14. The main locks 108 have elastically deformable protruding pieces that protrude downward into the cover 14 from the upper surface of the cover 14, the main locks 108 being formed, for example, into one piece with the cover 14. The main locks 108 respectively have engaging claws 110 that protrude outward in the longitudinal direction of the cover 14.

Furthermore, as is clear from FIG. 1, rectangular sub lock holes 112 may be formed in the lower end portion of the cover 14 at positions that correspond to the sub locking claws 32 of the main body 12, the rectangular sub lock holes 112 penetrating through the cover 14. In the present embodiment, two sub lock holes 112 are formed on the surface of the cover 14 that overlaps the front surface (see FIG. 2) of the main body 12, whereas three sub lock holes 112 are formed on the surface of the cover 14 that overlaps the rear surface (see FIG. 3) of the main body 12.

Furthermore, external locks 116 may be formed on outer surfaces of side walls 114a and 114b of the cover 14 that are opposite to each other in the longitudinal direction. The external locks 116 have substantially the same shape, and a pair of guiding sections 120 that have, for example, an L-shaped cross section and extend in the vertical direction may be formed on the two sides of an elastic piece 118 that protrudes outward from the side wall 114a (or 114b) and extends upward. The elastic piece 118 has an engagement protrusion 122.

Furthermore, the side wall 114a has vertical drain grooves 124a and 124b, whereas the side wall 114b has vertical drain grooves 124c and 124d. These vertical drain grooves 124a to 124d have substantially the same shape, and have the shape of a groove that opens to the inner surface of the cover 14 since the side wall 114a (or the 114b) protrudes outward from the cover 14, and extends in a straight line in the vertical direction. Note that the lower end edges of the vertical drain grooves 124a and 124b open on an open end surface 126 of the cover 14. Furthermore, a distance P1 between the vertical drain grooves 124a and 124b of the side wall 114a differs from a distance P2 between the vertical drain grooves 124a and 124b of the side wall 114b. The vertical drain groove 124a of the side wall 114a may be formed at a position that corresponds to the guide rib 36 of the main body 12. Accordingly, if an attempt is made to assemble the cover 14 to the main body 12 in the wrong direction, the guide rib 36 of the main body 12 will interfere with the cover 14, preventing a fault in coupling.

Figure 10:
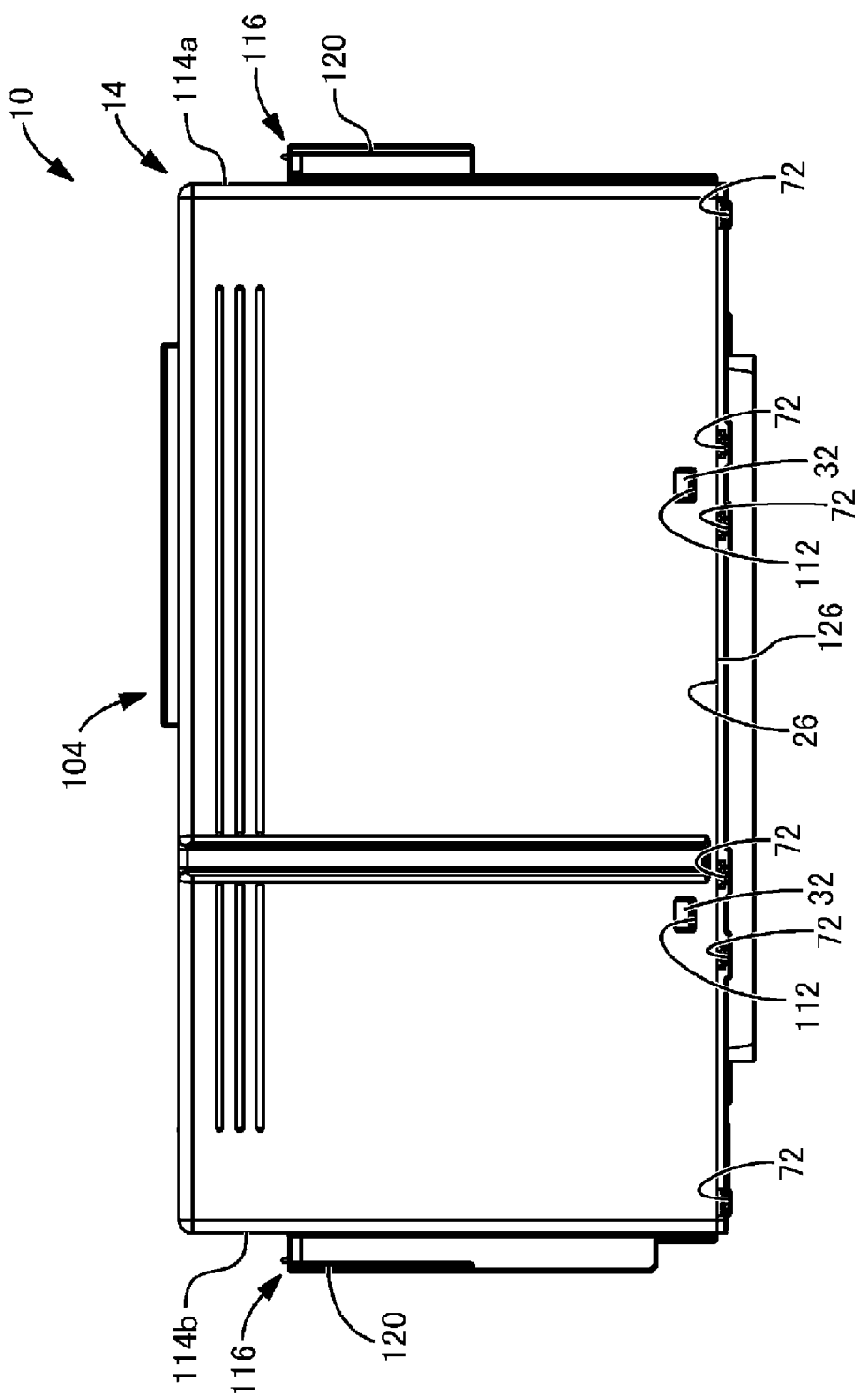
FIG. 10 is a front view showing the state in which the cover and the main body of the electrical junction box shown in FIG. 1 are assembled.

As shown in FIG. 1, the cover 14 may be externally fitted to the main body 12 from above. Note that, by the guide rib 36 provided on the side wall 34a of the main body 12 being inserted into the vertical drain groove 124a provided on the side wall 114a, the cover 14 can be guided in the vertical direction, which is the direction in which the cover is externally fitted to the main body 12, and can be externally fitted smoothly to the main body 12. The extent to which the cover 14 is externally fitted to the main body 12 is defined by the open end surface 126 of the cover 14 abutting against the abutment restricting surface 26 of the main body 12. Moreover, the cover 14 may be fixed to the main body 12 by the engaging claws 110 of the main locks 108 provided inside the cover 14 respectively engaging with the main locking claws 30 of the main body 12, and a plurality of sub lock holes 112 of the cover 14 respectively engaging with the sub locking claws 32 of the main body 12. Accordingly, as shown in FIG. 10, the main body 12 and the cover 14 are assembled to each other in the state in which the portion of the main body 12 that is located above the abutment restricting surface 26 is accommodated in the cover 14, and thus the electrical junction box 10 is formed. Furthermore, the plurality of fuse terminals 88 (see FIG. 1, for example) provided on the main body 12 are inserted into the terminal insertion holes 106 of the fuse mounted sections 104 provided on the cover 14, and are arranged in the fuse mounted sections 104. Furthermore, the upper portions of the drain recesses 72 of the main body 12 are covered by the open end surfaces 126 of the cover 14, and thereby drain holes that open outside the electrical junction box 10 are formed between the drain recesses 72 and the open end surfaces 126.

In the electrical junction box 10 having this structure, fuses (not shown) may be respectively mounted on the respective fuse mounted sections 104 and connected to the fuse terminals 88. The electrical junction box 10 may be configured to be accommodated in another electrical junction box (not shown) such as a relay box, for example, and fixed thereto via the external locks 116 provided on the cover 14, and thereby connectors provided in the other electrical junction box are inserted into connector accommodating sections 38 and connected to the connector terminals 90.

Figure 11:
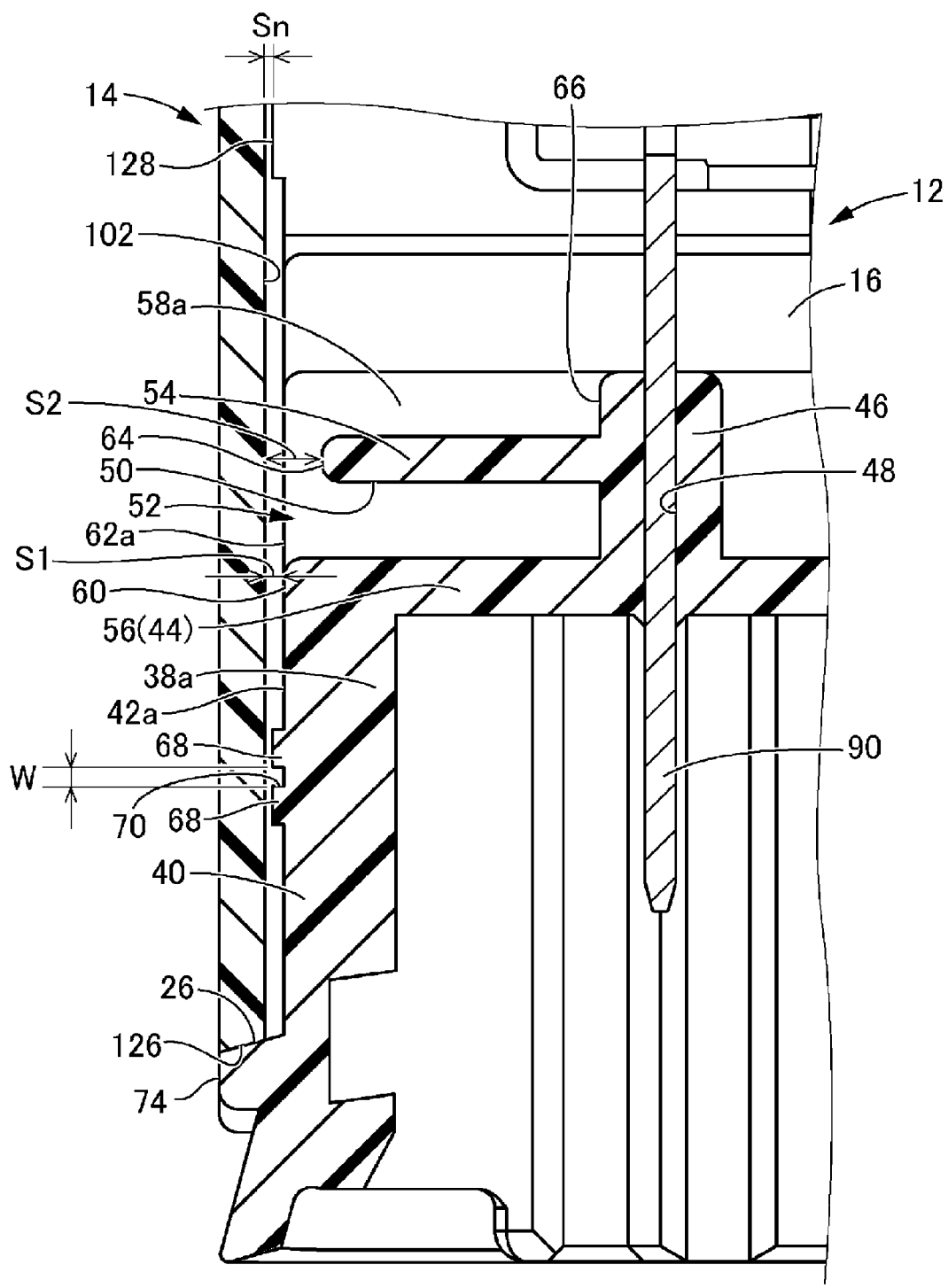
FIG. 11 is an enlarged view of the relevant part of FIG. 6 in the state in which the cover is assembled.

As shown in FIG. 11, by the cover 14 being assembled to the main body 12, the opposing surface 42a of the main body 12 opposes the inner surface 102 of the cover 14. Note that the opposing surface 42a is located slightly inward in the frame 16 (rightward in FIG. 11) relative to the outer surface 128 of the frame 16 located vertically above, and an opposing distance Si between the opposing surface 42a and the inner surface 102 of the cover 14 is defined to be slightly larger than an opposing distance Sn between the outer surface 128 and the inner surface 102. The opposing distance Sn between the outer surface 128 and the inner surface 102 is set to be very small since an unnecessary space is not provided between the main body 12 and the cover 14, and may be set to about 0.2 mm, for example, in the present embodiment. Furthermore, the opposing distance S1 between the opposing surface 42a and the inner surface 102 is set to be larger than the opposing distance Sn between the outer surface 128 and the inner surface 102, that is, to a distance in which no capillary action occurs, and to about 0.5 mm, for example.

Furthermore, by the cover 14 being assembled to the main body 12, each water capturing hole 50 formed in the corresponding opposing surface 42a has the shape of a recess that opens toward the inner surface 102 of the cover 14. Also, the upper opening edge 64 of the water capturing hole 50 is located further inward (rightward in FIG. 11) in the frame 16 than the lower opening edge 60, and is distanced from the inner surface 102 of the cover 14. Accordingly, an opposing distance S2 between the inner surface 102 of the cover 14 and the upper opening edge 64 is larger than the opposing distance S1 between the inner surface 102 and the lower opening edge 60. Also, the opposing distance S2 between the upper opening edge 64 and the inner surface 102 is ensured to be a distance that is sufficiently large such that no capillary action occurs.

Figure 12:
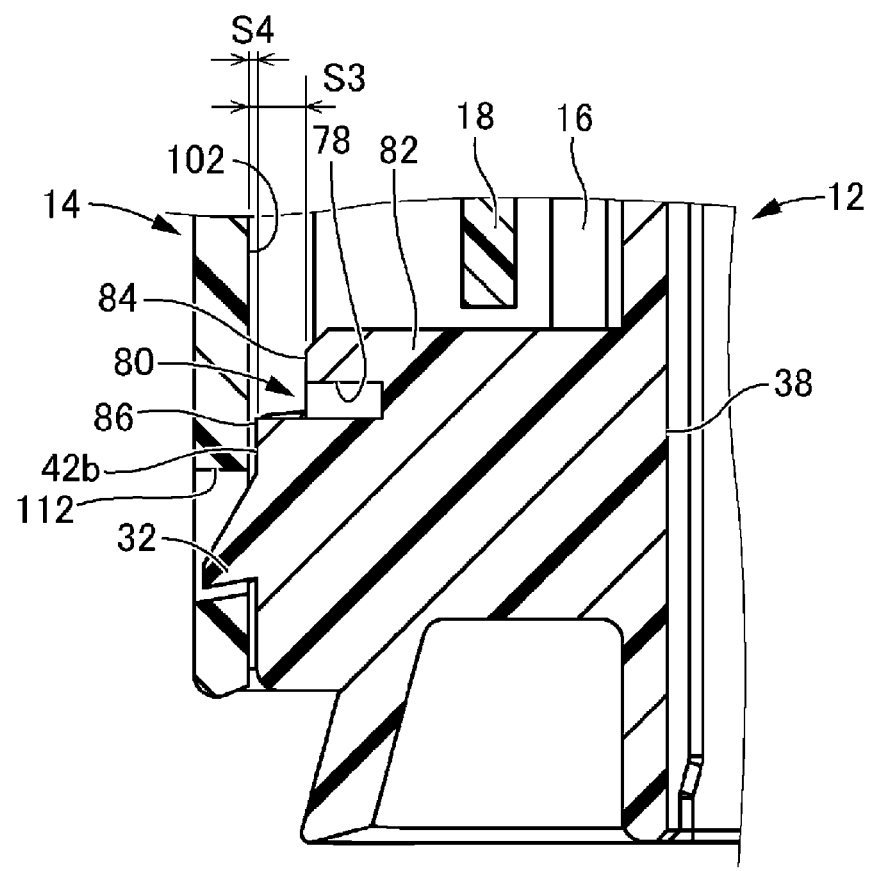
FIG. 12 is an enlarged view of the relevant part of FIG. 8 in the state in which the cover is assembled.

On the other hand, in the state in which the cover 14 is assembled to the main body 12 as shown in FIG. 12, the opposing surface 42b of the main body 12 opposes the inner surface 102 of the cover 14. Accordingly, the water capturing hole 78 has the shape of a recess that opens to the inner surface 102. Since the upper opening edge 84 of the water capturing hole 78 is distanced further from the inner surface 102 of the cover 14 than the lower opening edge 86, an opposing distance S3 between the inner surface 102 and the upper opening edge 84 is larger than an opposing distance S4 between the inner surface 102 and the lower opening edge 86. The opposing distance S3 between the upper opening edge 84 and the inner surface 102 is ensured to be a distance that is sufficiently large such that no capillary action occurs.

As shown in FIG. 11, in the electrical junction box 10 having the structure according to the present embodiment, the main body 12 has the water capturing holes 50, which form recesses that open to the inner surface 102 of the cover 14, and thus even if water enters, for example, a gap between the abutment restricting surface 26 of the main body 12 and the open end surface 126 of the cover 14, and climbs within the cover 14, it is possible to capture the water in the water capturing holes 50, and to prevent the water from reaching the printed-circuit board 18. Particularly, by the upper opening edges 64 of the water capturing holes 50 being located inside (rightward in FIG. 11) the main body 12, the opposing distance S2 between an upper opening edge 64 and the inner surface 102 of the cover 14 is ensured to be a distance at which no capillary action occurs. Accordingly, water is prevented from moving upward relative to the water capturing hole 50 due to capillary action, making it possible to reliably capture the water in the water capturing hole 50.

Furthermore, the water receiving sections 66 are formed above the water capturing holes 50. Accordingly, even if water moves upward relative to a water capturing hole 50 due to an excessive inclination, shake, or the like of a vehicle, it is possible to retain the water in the water receiving section 66 and to prevent the water from being further spread. As a result, it is possible to effectively prevent the printed-circuit board 18 from getting wet.

Moreover, the water capturing grooves 70 are formed below the water capturing holes 50. Accordingly, water that has entered the cover 14 and climbed can be captured in the water capturing grooves 70 prior to the water capturing holes 50. A groove width W of the water capturing grooves 70 is set to a very small width at which capillary action can occur. Accordingly, it is possible to guide the water in the horizontal direction using capillary action, preventing the water from moving upward. Since the drain recesses 72 are formed below (rightward in FIG. 5) one end edge of the water capturing grooves 70, it is possible to let the water that was captured by a water capturing groove 70 and guided to that end edge of the water capturing groove 70 fall in the drain recess 72, and to drain the water from the drain recess 72 to the outside of the electrical junction box 10. Accordingly, since the two types of capturing means, namely, the water capturing groove 70 and the water capturing holes 50 are provided, it is possible to effectively prevent water from moving upward and effectively prevent the printed-circuit board 18 from getting wet.

Furthermore, the opposing surface 42a that has the water capturing hole 50 is also located further inside (rightward in FIG. 11) the main body 12 than the outer surface 128 located above, the separation distance Si is ensured to be a distance in which no capillary action occurs between the opposing surface 42a and the inner surface 102 of the cover 14. Therefore, it is possible to prevent capillary action from occurring between the opposing surface 42a and the inner surface 102 of the cover 14, and to effectively prevent water from climbing on the opposing surface 42a. Particularly, the opposing surface 42a may be formed continuously from the abutment restricting surface 26. Accordingly, at the time when water enters between the open end surface 126 of the cover 14 and the abutment restricting surface 26 of the main body 12, it is possible to prevent capillary action from occurring, and to prevent the water from moving further upward.

Furthermore, the water capturing hole 50 is formed above and adjacent to the connector accommodating section 38a. Accordingly, it is possible to effectively use the depth dimension (size in the horizontal direction in FIG. 11) of the connector accommodating section 38a, thereby space-efficiently forming the water capturing hole 50 into a shape with a deep bottom. Furthermore, since the water capturing hole 50 is shaped with a deep bottom, it is possible to reduce the risk that water runs over from the water capturing hole 50 even when a vehicle is inclined, for example.

Furthermore, as shown in FIG. 12, the rear surface side (see FIG. 3) of the main body 12 also has the water capturing holes 78. Accordingly, it is possible to capture water that has entered the cover 14 in the water capturing holes 78 as well. Furthermore, since the opposing distance S3 between the upper opening edge 84 and the inner surface 102 of the cover 14 is set to be larger than the opposing distance S4 between the lower opening edge 86 and the inner surface 102 and to a distance at which no capillary action occurs, the water capturing holes 78 can also prevent the water from moving upward relative to the water capturing hole 78. As a result, it is possible to reliably capture the water in the water capturing holes 78, and to prevent the water from reaching the printed-circuit board 18. Moreover, since the sub locking claws 32 are formed, and the water capturing holes 78 are formed on the opposing surfaces 42b at which capillary action easily occurs with the inner surface 102 so that the water capturing holes 78 are the closest to the inner surface 102 of the cover 14, it is possible to effectively prevent the water from moving upward. Moreover, since three water capturing holes 78 are formed with substantially the same intervals on the rear surface of the main body 12, it is possible to achieve the effect of preventing water transfer substantially evenly in the longitudinal direction of the main body 12.

Furthermore, the vertical drain grooves 124a to 124d are formed on the side walls 114a and 114b of the cover 14, and opposing distances between the vertical drain grooves 124a to 124d and the corresponding side walls 34a and 34b of the main body 12 are large. As a result, capillary action between the side walls 114a, 114b of the cover 14 and the side walls 34a, 34b of the main body 12 can be prevented in the vertical drain grooves 124a to 124d, making it possible to capture water moving between the side walls 114a, 114b and the side walls 34a, 34b in the vertical drain grooves 124a to 124d, to achieve a further improvement in the effect of preventing water transfer.

Preferred embodiments have been described in detail so far, but the present invention is not limited to the embodiments discussed herein. For example, the opening shape of the water capturing hole is not limited to the elongated rectangular shape, and any shape can be adopted taking into consideration the specific shape of the main body and the like. Furthermore, the water capturing holes can be formed at any positions of the main body, and the number of water capturing holes is not restricted.

Furthermore, although the water capturing grooves are not necessarily needed, the water capturing grooves may have, for example, a shape extending in the horizontal direction while being inclined in the vertical up-down direction, for example. Accordingly, it is possible to effectively guide water using gravity action together with capillary action.

The invention claimed is:

1. An electrical junction box comprising:
   a main body provided with a circuit board; and
   a cover externally fitted to the main body, the electrical junction box being assembled in a state in which the main body is accommodated in the cover,
   the main body including an opposing surface that opposes an inner surface of the cover, the opposing surface having a water capturing hole that is a first recess that opens toward the inner surface of the cover, and
   a first opposing distance between the inner surface of the cover and an upper opening edge of the water capturing hole is larger than a second opposing distance between the inner surface of the cover and a lower opening edge of the water capturing hole.

2. The electrical junction box according to claim 1, wherein
   the water capturing hole includes an opening having an elongated rectangular shape extending in a horizontal direction, and
   the water capturing hole has a depth dimension greater than or equal to a longitudinal dimension of the opening.

3. The electrical junction box according to claim 1, wherein
   the opposing surface of the main body that opposes the inner surface of the cover is provided with a water capturing groove arranged to guide water in a horizontal direction using capillary action, the water capturing groove being provided below the water capturing hole.

4. The electrical junction box according to claim 3, wherein
   the water capturing groove is formed between first and second water stopping protrusions protruding from the opposing surface of the main body toward the inner surface of the cover.

5. The electrical junction box according to claim 4, wherein
   the first and second water stopping protrusions extend parallel to each other and are spaced from each other vertically.

6. The electrical junction box according to claim 3, wherein
   the main body further includes an abutment restricting surface arranged to abut an open end surface of the cover, the abutment restricting surface having a drain recess formed therein, at least part of the drain recess being aligned with the water capturing groove in the horizontal direction.

7. The electrical junction box according to claim 1, wherein
   a water receiving section that is a second recess that opens upward is formed above the water capturing hole of the main body.

8. The electrical junction box according to claim 7, wherein
   the water capturing hole is formed by first and second sidewall sections between which the upper opening edge and the lower opening edge of the water capturing hole extend, an upper wall section having the upper opening edge, and a lower wall section having the lower opening edge.

9. The electrical junction box according to claim 8, wherein
   the first and second sidewall sections extend above the water capturing hole such that the water receiving section is formed by the first and second sidewall sections and the upper wall section of the water capturing hole.

10. The electrical junction box according to claim 1, wherein
    the main body includes a connector accommodating section that opens downward, and
    the water capturing hole is formed above and adjacent to the connector accommodating section, a lower wall section of the water capturing hole being common with an upper wall section of the connector accommodating section.

11. The electrical junction box according to claim 1, wherein
    the main body further includes an abutment restricting surface arranged to abut an open end surface of the cover, the abutment restricting surface having a drain recess formed therein.

12. The electrical junction box according to claim 11, wherein
    the drain recess has a plurality of ribs protruding therefrom.

* * * * *